(12) United States Patent
Seningen et al.

(10) Patent No.: US 8,780,657 B2
(45) Date of Patent: Jul. 15, 2014

(54) MEMORY WITH BIT LINE CURRENT INJECTION

(75) Inventors: Michael R. Seningen, Austin, TX (US); Michael E. Runas, McKinney, TX (US)

(73) Assignee: Apple Inc., Cupertino, CA (US)

( * ) Notice: Subject to any disclaimer, the term of this patent is extended or adjusted under 35 U.S.C. 154(b) by 253 days.

(21) Appl. No.: 13/409,399

(22) Filed: Mar. 1, 2012

(65) Prior Publication Data

US 2013/0229877 A1 Sep. 5, 2013

(51) Int. Cl.
*G11C 7/00* (2006.01)

(52) U.S. Cl.
USPC .......................................... 365/201; 365/200

(58) Field of Classification Search
CPC ........................ G11C 5/145; H01L 27/11521
USPC .................................................. 365/201, 200
See application file for complete search history.

(56) References Cited

U.S. PATENT DOCUMENTS

| | | | |
|---|---|---|---|
| 5,068,830 A | 11/1991 | Plants et al. | |
| 5,610,866 A | 3/1997 | McClure | |
| 6,006,339 A | 12/1999 | McClure | |
| 6,052,321 A | 4/2000 | Roohparvar | |
| 6,169,696 B1 | 1/2001 | Bissey | |
| 6,268,972 B1 | 7/2001 | Philpott et al. | |
| 6,363,001 B1 | 3/2002 | Borot et al. | |
| 6,538,940 B1 | 3/2003 | Nahas et al. | |
| 6,574,159 B2 | 6/2003 | Ohbayashi et al. | |
| 6,611,448 B2 | 8/2003 | Nair et al. | |
| 6,885,600 B2 | 4/2005 | Tran et al. | |
| 7,164,612 B1 | 1/2007 | Eleyan et al. | |
| 7,184,337 B2 | 2/2007 | Versen | |
| 7,298,659 B1 | 11/2007 | Kengeri et al. | |
| 7,313,041 B1 | 12/2007 | Chapman et al. | |
| 7,642,620 B2 | 1/2010 | Tanaka | |
| 7,675,783 B2 | 3/2010 | Park et al. | |
| 7,724,584 B2 | 5/2010 | Lee | |
| 7,805,645 B2 | 9/2010 | Frey et al. | |
| 7,872,929 B2 | 1/2011 | Dell et al. | |
| 8,611,165 B2 * | 12/2013 | Kazuno | 365/201 |
| 2003/0107920 A1 | 6/2003 | Roohparvar | |

(Continued)

FOREIGN PATENT DOCUMENTS

KR 20030079078 10/2003

OTHER PUBLICATIONS

Mukhopadhyay et al.; "Leakage Current Based Stabilization Scheme for Robust Sense-Amplifier Design for Yield Enhancement in Nanoscale SRAM;" Proceedings of the 14th Asian Test Symposium (ATS '05), Dec. 18-21, 2005; pp. 176-181.

(Continued)

*Primary Examiner* — Son Dinh
*Assistant Examiner* — Nam Nguyen
(74) *Attorney, Agent, or Firm* — Meyertons, Hood, Kivlin, Kowert & Goetzel, P.C.

(57) ABSTRACT

Embodiments of a memory are disclosed that may allow for the detection of weak data storage cells or may allow operation of data storage cells under conditions that may represent the effects of transistor ageing. The memory may include data storage cells, a column multiplexer, a sense amplifier, and a current injector. The current injector may be configured to generate multiple current levels and may be operable to controllably select one of the current levels to either source current to or sink current from the input of the sense amplifier.

20 Claims, 10 Drawing Sheets

(56) References Cited

U.S. PATENT DOCUMENTS

| | | |
|---|---|---|
| 2003/0206435 A1 | 11/2003 | Takahashi |
| 2006/0242386 A1 | 10/2006 | Wood |
| 2009/0021996 A1 | 1/2009 | Versen et al. |
| 2009/0323446 A1 | 12/2009 | Zhang et al. |
| 2010/0246293 A1 | 9/2010 | Dudeck et al. |
| 2011/0116300 A1 | 5/2011 | Maejima |
| 2012/0008384 A1 | 1/2012 | Li et al. |
| 2012/0069638 A1* | 3/2012 | Matsuda et al. ............ 365/158 |
| 2012/0230116 A1 | 9/2012 | Goda et al. |

OTHER PUBLICATIONS

Paul Zuber, et al., "A Holistic Approach for Statistical SRAM Analysis," published in 47th ACM/IEEE Design Automation Conference (DAC), Jun. 13-18, 2010, pp. 717-722.

Mohamed H. Abu-Rahma, et al., "A Methodology for Statistical Estimation of Read Access Yield in SRAMs," published in 45th ACM/IEEE Design Automation Conference (DAC), Jun. 8-13, 2008, pp. 205-210.

* cited by examiner

MEMORY WITH BIT LINE CURRENT INJECTION

BACKGROUND

1. Technical Field

This invention is related to the field of memory implementation, and more particularly to techniques for data storage cell testing.

2. Description of the Related Art

Memories typically include a number of data storage cells composed of interconnected transistors fabricated on a semiconductor substrate. Such data storage cells may store a single data bit or multiple data bits and may be constructed according to a number of different circuit design styles. For example, the data storage cells may be implemented as a single transistor coupled to a capacitor to form a dynamic storage cell. Alternatively, cross-coupled inverters may be employed to form a static storage cell or a floating gate MOSFET may be used to create a non-volatile storage cell.

During the semiconductor manufacturing process, variations in lithography, transistor dopant levels, etc., may result in different electrical characteristics between transistors that are intended to have identical characteristics. Additional variation in electrical characteristics may occur due to aging effects within transistors as the device is repeatedly operated. These differences in electrical characteristics between transistors can result in data storage cells that output different small signal voltages for the same stored data. In a memory array, there may be a large variation in the small signal output voltages across the data storage cells that comprise the memory array.

Data from data storage cells that generate a smaller than average output signal due to the previously described variation may not be able to be read correctly, resulting in a misread. Data storage cells that fail to read properly may contribute to lower manufacturing yield and necessitate additional redundant data storage cells to maintain manufacturing yield goals.

SUMMARY

Various embodiments of a memory circuit are disclosed. In an embodiment, the memory circuit may include data storage cells, a column multiplexer, a sense amplifier, and a current injector. The current injector may source current to the input of the sense amplifier. In some embodiments, the current injector may be operable to controllably source current to one of the inputs of sense amplifier configured to amplify a differentially encoded signal.

The current injector may be configured to generate multiple current levels and may be operable to controllably select one of the current levels to source to the input of the sense amplifier. In some embodiments, the current injector may be configured to sink current from the input of the sense amplifier.

During operation, test data may be stored into a data storage cell. The stored data may be read from the data storage cell using a sense amplifier and compared to the original test data. The stored data may also be read from the data storage cell using the sense amplifier while sourcing current to the input of the sense amplifier and compared to the original test data. The result of these comparisons may be used to determine the strength of the data storage cell. In some embodiments, information indicative of the strength of the data storage cell may be stored for later use.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the disclosure is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such, descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

During the manufacture of a semiconductor memory circuit, differences in lithography, implant levels, etc., may result in differences in electrical characteristics between data storage cells that are otherwise intended to be identical in characteristics and performance. In some cases, the variation of the electrical characteristics of a data storage cell may be sufficiently large that the data storage cell may not function (e.g., read or write) under normal operating conditions of the memory circuit, resulting in the data storage cell being identified as a failure and requiring replacement with a redundant data storage cell. Adding redundant data storage cells to the memory circuit to compensate for data storage cells with non-ideal electrical characteristics may result in additional chip area and power consumptions. The embodiments illustrated below may provide techniques to identify and compensate for data storage cells with non-ideal electrical characteristics.

Figure 1:
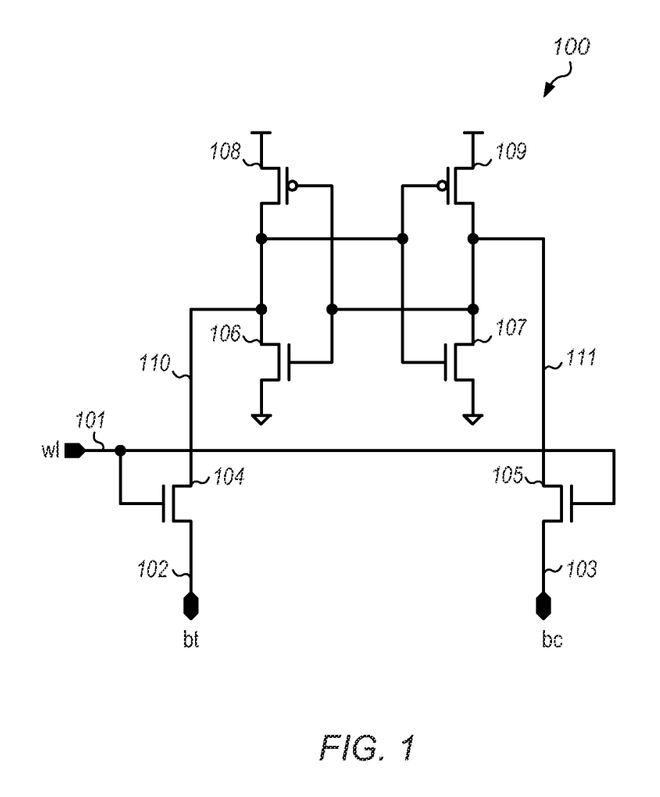
FIG. 1 illustrates an embodiment of a data storage cell.

FIG. 1 illustrates a data storage cell according to one of several possible embodiments. In the illustrated embodiment, data storage cell 100 includes a true I/O 102 denoted as "bt," a complement I/O 103 denoted as "bc," and a selection input 101 denoted as "wl."

In the illustrated embodiment, bt 102 is coupled to selection transistor 104 and bc 101 is coupled to selection transistor 105. Selection transistor 104 and selection transistor 105 are controlled by wl 101. Selection transistor 104 is further coupled to pull-up transistor 108 and pull-down transistor 106 through node 110, and selection transistor 105 is further coupled to pull-up transistor 109 and pull-down transistor 107 through node 111. Pull-up transistor 108 and pull-down transistor 106 are controlled by node 111, and pull-up transistor 109 and pull-down transistor 107 are controlled by node 110.

It is noted that although selection transistors, pull-up transistors, pull-down transistors, and pre-charge transistors may be illustrated as individual transistors, in other embodiments, any of these transistors may be implemented using multiple transistors or other suitable circuits. That is, in various embodiments, a "transistor" may correspond to an individual transistor or other switching element of any suitable type (e.g., a field-effect transistor (FET)), or to a collection of transistors.

At the start of the storage operation true I/O 102 and complement I/O 103 may both be high and selection input 101 may be low. It is noted that in this embodiment, low refers to a voltage at or near ground potential and high refers to a voltage sufficiently large to turn on n-channel metal oxide semiconductor field-effect transistors (MOSFETs) and turn off p-channel MOSFETs. In other embodiments, other circuit configurations may be used and the voltages that constitute low and high may be different. During the storage, or write, operation, selection input 101 may be switched high which couples true I/O 102 to node 110 and complement I/O 103 to node 111. To store a logical 1 into data storage cell 100, complement I/O 103 may be switched to a low. Since selection transistor 105 is on, node 111 is also switched low. The low on node 111 activates pull-up transistor 108 which charges node 110 high. The high on node 110, in turn, activates pull-down transistor 107, which further reinforces the low on node 111 establishing regenerative feedback. Once this regenerative feedback between nodes 110 and 111 has been established, selection input 101 may be switched low turning off selection transistor 104 and selection transistor 105, isolating node 110 from true I/O 102 and node 111 from complement I/O 103. The method of storing a logical 0 may be similar. Selection input 101 may be switched high and true I/O 102 may be switched low. Selection transistor 104 couples the low on true I/O 102 to node 110, which activates pull-up transistor 109. The high on node 111 activates pull-down transistor 106, reinforcing the low on node 110 and establishing the regenerative feedback. Data storage cells that store data via regenerative feedback are commonly referred to as static cells.

In the illustrated embodiment, data storage cell 100 outputs its stored data as the difference in voltage between true I/O 102 and complement I/O 103. (Data stored as the difference between two voltages may also be referred to herein as "differentially encoded".) At the start of the output process, true I/O 102 and complement I/O 103 may both be high and selection input 101 may be low. Asserting selection input 101 activates selection transistor 104 and selection transistor 105. If node 111 is low and node 110 is high, then a current will flow through selection transistor 105 and pull-down transistor 107 causing a reduction in voltage on complement I/O 103. If node 110 is low and node 111 is high, then a current will flow through selection transistor 104 and pull-down transistor 106 causing a reduction in voltage on true I/O 102. For either data state, the current that the data storage cell sinks from either the true I/O 102 or complement I/O 103 is referred to as the read current of the cell.

Ideally, the electrical characteristics of pull-down transistor 106 and pull-down transistor 107 would be identical, as would be the electrical characteristics of selection transistor 104 and selection transistor 105. Furthermore, in an ideal circuit, it might be desirable that pull-down transistor 106 and pull-down transistor 107 in one data storage cell in a memory device have identical electrical characteristics to pull-down transistor 106 and pull-down transistor 107 in another data storage cell in the memory device. However, during the semiconductor manufacturing process, differences in lithography, fluctuations in dopant levels, etc., may result in these transistors having different electrical characteristics (e.g., saturation current). Aging effects induced by, e.g., hot-carrier injection may also change a transistor's electrical characteristics over time. Variation, due to both manufacturing and aging effects, in pull-down transistor 106, pull-down transistor 107, selection transistor 104 and selection transistor 105 from one data storage cell to another may result in variation in read currents, and, therefore variation in output voltages for the same stored data.

In some cases, the variation in the electrical characteristics of the transistors may result in larger than average output voltages when the storage cell is read. Data storage cells that generate larger than average output voltages may be referred to as strong cells. In some cases, the variation in the electrical characteristic of the transistors may result in smaller than average output voltages when the storage cell is read. Data storage cells that generate smaller than average output voltages may be referred to as weak cells. If the value of the output voltage generated by a weak storage cell is sufficiently small, it may not be possible to properly determine the data stored in the data storage cell in a timely manner, or not at all, because the output voltage may not be able to overcome imbalances and signal noise within a sense amplifier.

It is noted that the number of transistors and the connectivity shown in FIG. 1 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as in a single-bit or multi-bit non-volatile or flash memory) may be used to store data in a data storage cell.

Figure 2:
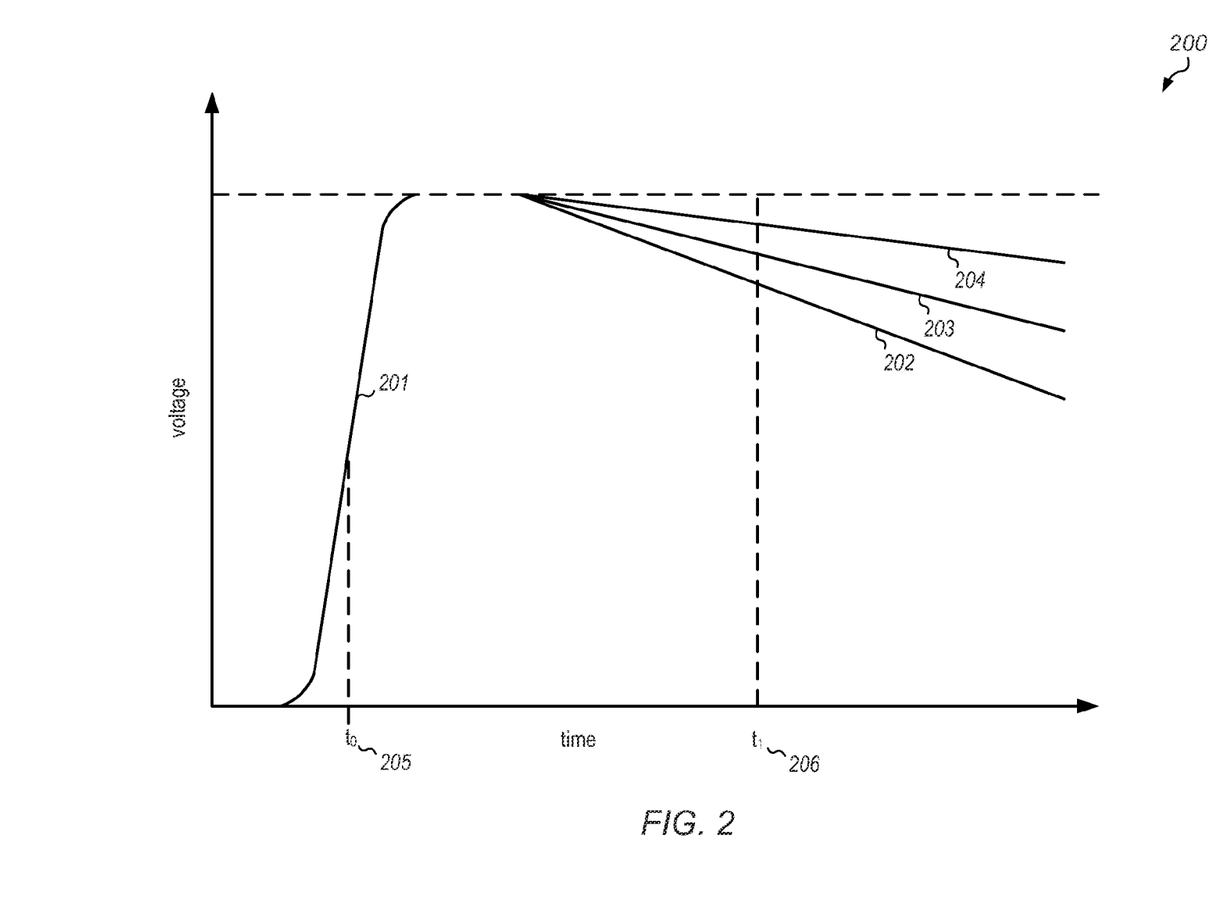
FIG. 2 illustrates possible waveforms for the discharge of bit lines.

FIG. 2 illustrates possible waveforms resulting from the operation of the embodiment of the data storage cell shown in FIG. 1. At time $t_0$ 205, the selection input 101 is asserted (waveform 201). Depending on the value of the stored data, either true I/O 102 or complement I/O 103 will begin to discharge (waveform 203). At time $t_1$ 206, the small signal differential between true I/O 102 and complement I/O 103 is amplified by a sense amplifier. The system including one or more data storage cells may be modeled as a capacitor and current source. The capacitor represents the total capacitance present on either true I/O 102 or complement I/O 103 which may include the junction capacitance of other data storage cells I/O ports and the capacitance of the interconnect between the data storage cells. The current source is the read current of the data storage cell. With this model, the voltage on the low-going I/O from time $t_0$ to time $t_1$ can be estimated using equation 1.

$$v(t) = \frac{1}{C}\int_{t_0}^{t_1} i(t)dt \quad (1)$$

Over a limited range of time and voltages, the read current can be treated as a constant. This allows the equation to be simplified as shown in equation 2. For a constant load capacitance, the voltage change on the low-going I/O is proportional to the read current of the data storage cell. If the read current of the data storage cell is less than average, then the change in voltage on the low-going I/O will be less (waveform 204), resulting in a smaller differential voltage at the time the sense amplifier is activated. If the read current of the data storage cell is larger than average, then the change in voltage on the low-going I/O will be greater (waveform 202), resulting in a larger differential at the time the sense amplifier is activated. It is noted that the waveforms shown in FIG. 2 are merely an illustrative example and that, in other embodiments, differing waveform behavior may be possible.

$$\Delta v = \frac{t_{read}}{C(t_1 - t_0)} \quad (2)$$

Figure 3:
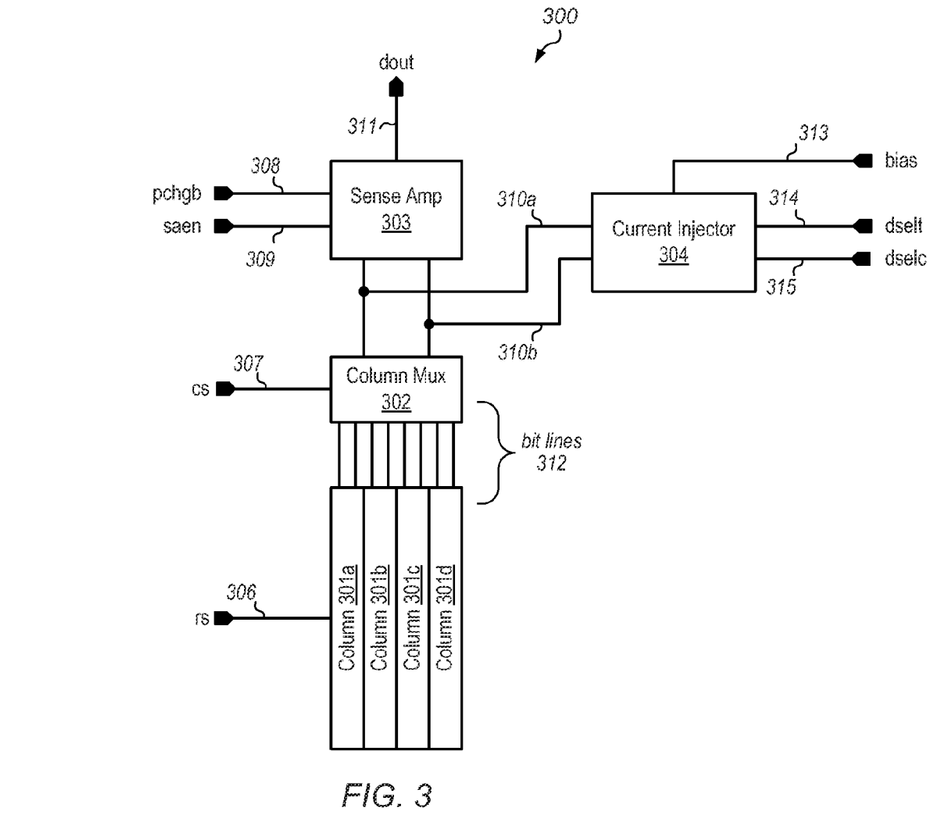
FIG. 3 illustrates an embodiment of a memory sub-array.

FIG. 3 illustrates an embodiment of a memory sub-array which includes a data output 311 denoted as "clout," a pre-charge control input 308 denoted as "pchgb," a sense amplifier enable input 309 denoted as "saen", a true data selection input 314 denoted as "dselt;" a complement data selection input 315 denoted as "dselc," and a bias input 313. The illustrated embodiment also includes one or more column selection inputs 307 denoted as "cs" and one or more row selection inputs 304 denoted as "rs."

In the illustrated embodiment, columns 301a, 301b, 301c, and 301d are coupled to the inputs of column multiplexer 302 through bit lines 312. The differentially encoded output of column multiplexer 302 is coupled to the differential inputs of sense amplifier 303 through nodes 310a and 310b, and the output of sense amplifier 303 is coupled to dout 311. Current injector 304 is also coupled to the differential inputs of sense amplifier 303.

Each column 301 may include one or more of data storage cell 100. For example, the individual bit lines bt 102 of each data storage cell 100 within in a column 301 may be coupled together to form a true bit line 312 of column 301. Likewise, the individual bit lines bc 103 of each data storage cell 100 within column 301 may be coupled together to form a complement bit line 312 of column 301. Individual word lines wl 101 of each data storage cell 100 within column 301 may coupled to a respective one of row select signals rs 306 such that when a given rs 306 is asserted, the corresponding data storage cell 100 creates a differentially encoded output on the true bit line and complement bit line of column 301, while the bit line outputs of the remaining data storage cells 100 within column 301 remain quiescent. In other embodiments, the data storage cells may be dynamic storage cells, single-bit or multi-bit non-volatile storage cells, or mask programmable read-only storage cells. It is noted that in some embodiments, the data storage cell may transmit data in a single-ended fashion. In such cases, only a single bit line per column is required.

In some embodiments, column multiplexer 302 may contain one or more pass gates controllable by cs 307. The input of each pass gate may be coupled to the either the true or complement bit line output from one of columns 301a, 301b, 301c, and 301d. The output of each pass gate coupled to a true bit line is coupled to the true output of column multiplexer 302 in a wired-OR fashion, and the output of each pass gate coupled to a complement bit line is coupled to the complement output of column multiplexer 302 in a wired-OR fashion. In other embodiments, column multiplexer 302 may contain one or more logic gates configured to perform the multiplexer selection function.

Sense amplifier 303 may use analog amplification techniques in some embodiments. In other embodiments, sense amplifier 303 may employ a latch based amplification technique. Current injector 304 may contain bias transistors and selection transistors as will be described in reference to FIG. 5 and FIG. 6.

In some embodiments, the illustrated sub-array 300 may operate as follows. Referring collectively to FIG. 3 and the flowchart illustrated in FIG. 4, the operation may start by initializing the sub-array (block 401) by setting pchgb 308 low and setting rs 306, cs 307, and saen 309 to inactive states. Once sub-array 300 has been initialized, one of rs 306 may be asserted (block 402) selecting a data storage cell in each of columns 301a, 301b, 301c, and 301d. One of cs 307 may then be asserted (block 403), causing column multiplexer 302 to output data selected from one of bit lines 312.

Figure 4:
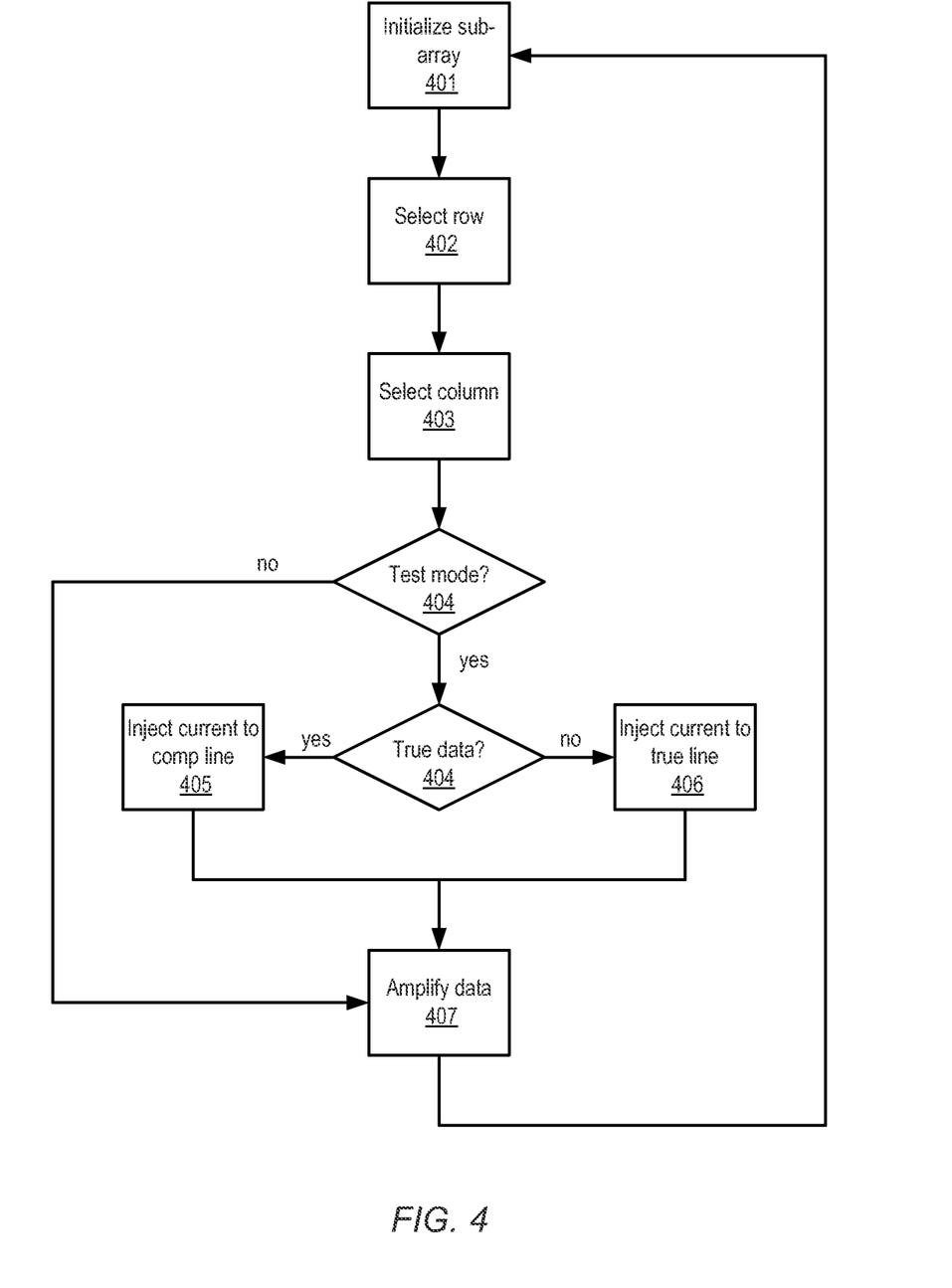
FIG. 4 illustrates a possible method of operating the embodiment illustrated in FIG. 3.

The operation then depends on whether or not sub-array 300 is operating in test mode (block 404). When sub-array 300 is not operating in test mode, pchgb 308 may be set high (disabling pre-charge) and saen 309 may be asserted causing sense amplifier to amplify the difference between nodes 310a and 310b and couple the amplified result to dout 311 (block 407). Sub-array 300 may then be re-initialized by de-asserting saen 309, and the asserted one of rs 306 and cs 307, and setting pchgb 308 low (block 401).

When sub-array 300 is operating in test mode, the operation then depends on the value of the test data previously loaded into the selected data storage cell (block 404). When a logical 1 was loaded into the selected data storage cell, dselc 315 may be set low causing current injector 304 to source current onto the complement input of sense amplifier 303. With the additional current, the equation governing the change of voltage on the complement input of sense amplifier 303 can re-written as shown in Equation 3. Since the change in voltage is proportional to the total current, the change in voltage on the complement input of sense amplifier 303 may be reduced. Once the additional current is being source to the complement input of sense amplifier 303, the amplification operation (block 407) and initialization operation (block 401) can proceed as described above.

$$\Delta v = \frac{(t_{read} - t_{injected})}{C(t_2 - t_0)} \quad (3)$$

Figure 5:
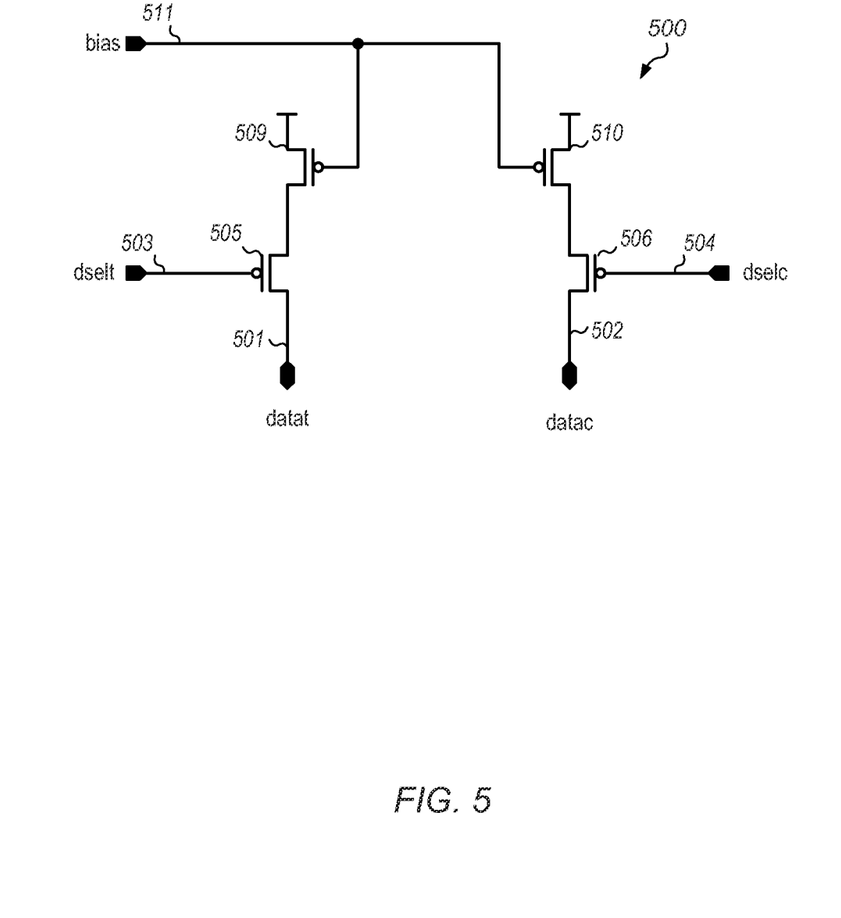
FIG. 5 illustrates an embodiment of a current injector.

FIG. 5 illustrates an embodiment of a current injector for use with differentially encoded data. The illustrated embodiment includes a true data port 501 and a complement data port 502, respectively denoted as "datat" and "datac," as well as a bias input 511. The embodiment further includes a true data selection input 503 and a complement data selection input 504, respectively denoted as "dselt" and "dselc."

In the illustrated embodiment, datat 501 is coupled to selection transistor 505 and datac 502 is coupled to selection transistor 506. Selection transistor 505 is controlled by dselt 503 and selection transistor 506 is controlled by dselc 504. Selection transistor 505 is further coupled to bias transistor 507 and selection transistor 506 is further coupled to bias transistor 510. Bias transistor 509 and bias transistor 510 are controlled by bias 511. In some embodiments, the transconductance of bias transistor 509 is the same as the transconductance of bias transistor 510. Bias transistor 509 and bias transistor 510 may be "matched", that is, the physical design of the two transistors follows additional design rules to minimize variation in electrical characteristics between the transistors resulting from differences in lithography, variations in dopant levels, etc. In other embodiments, current injector 500 may include self-biasing circuitry to generate bias 511 internal to current injector 500.

During normal read operation, bias 511 may be set high, turning off bias transistors 509 and 510. Dselt 503 and dselc 504 may both be set high, de-activating selection transistors 505 and 506, and de-coupling datat 501 and datac 502 from their respective bias transistors. During test read operation, bias 511 may be set to an analog voltage level causing a current to flow through bias transistors 509 and 510. When test data is to be read from a data storage cell, either dselt 503 or dselc 504 may be set low depending on the anticipated value of the test data. For example, it the test data to be read is a logical 1, then dselc 504 may be be set low activating selection transistor 506 and sourcing current from bias transistor 510 to datac 502.

Figure 6:
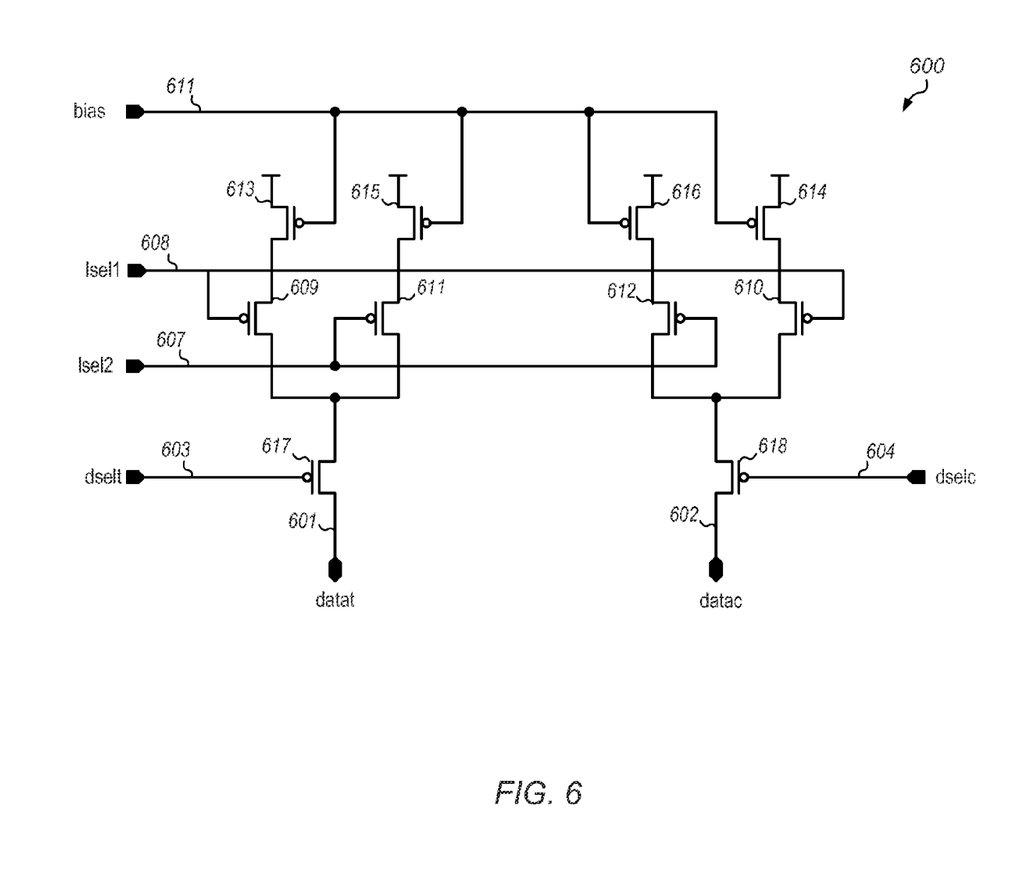
FIG. 6 illustrates an embodiment of a current injector with multiple current levels.

FIG. 6 illustrates a variant of current injector 500 that provides multiple current levels. In the illustrated embodiment, current injector 600 includes a number of input and I/O ports similar to current injector 500: a true data I/O 601, a complement data I/O 602, respectively denoted as "datat" and "datac," a true data selection input 603 and a complement data selection input 604, respectively denoted as "dselt" and "dselc," and a bias input 611. In contrast to current injector 500, current injector 600 includes a first current level selection input 608 denoted as "lsel1," and a second current level selection input 607 denoted as "lsel2."

As shown in FIG. 6, datat 601 is coupled to selection transistor 617 and datac 602 is coupled to selection transistor 618. Selection transistor 617 is controlled by dselt 603 and selection transistor 618 is controlled by dselc 604. Selection transistor 617 is further coupled to selection transistor 609 and selection transistor 611. Selection transistor 618 is further coupled to selection transistor 612 and selection transistor 610. Selection transistor 609 and selection transistor 610 are controlled by lsel1 608, and selection transistor 611 and selection transistor 612 are controlled by lsel2 607. Selection transistor 609 is coupled to bias transistor 613, and selection transistor 611 is coupled to bias transistor 615. Selection transistor 612 is coupled to bias transistor 616, and selection transistor 610 is coupled to bias transistor 614. Bias transistors 613, 614, 615, and 616 are controlled by bias 611.

In some embodiments, the transconductance of bias transistors 613, 614, 615, and 616 may be equal. In other embodiments, the transconductance of bias transistors 613 and 614 may be equal, and the transconductance of bias transistors 615 and 616 may be equal but different from the transconductance value of bias transistors 613 and 614, allowing for different current levels. The differing transconductance values may be implement by changing the electrical characteristics of the transistors (e.g., adjusting dopant levels), or by adjusting the physical size of the transistor. For example, making bias transistor 615 twice the size of bias transistor 613 may allow bias transistor 615 to source twice as much current. In other embodiments, the bias transistors may be controlled by multiple bias signals. It is noted that in other embodiments, different configurations, types, and numbers of transistors may be employed.

During normal read operation, bias 611 may be set high to turn off bias transistors 613, 614, 615, and 616. Dselt 603 and dselc 604 are both set high, turning off selection transistors 617 and 618, isolating current injector 600 from its load. During test operation, bias signal 611 may be set to analog voltage level which causes current to flow in bias transistors 613, 614, 615, and 616. In some embodiments, bias signal 611 may be generated by voltage reference circuit designed to supply a constant voltage over a range of supply voltages and temperatures. The bias signal may be generated as part of a current mirror circuit and bias transistors 613, 614, 615, and 616 may comprise the last stages of the mirror. In other embodiments, bias signal 611 may be supplied externally by a tester or other suitable hardware. When test data is to be read from a data storage cell, either dselt 603 or dselc 604 may be set low depending on the anticipated value of the test data, and either lsel1 608 or lsel2 607 may be set low depending on the desired current level. For example, it the test data to be read is a logical 1 and current level 2 is to be used, then dselc 604 and lsel2 may be set low activating selection transistors 618 and 612, allowing the current provided by bias transistor 616 to flow to datac 602.

Figure 7:
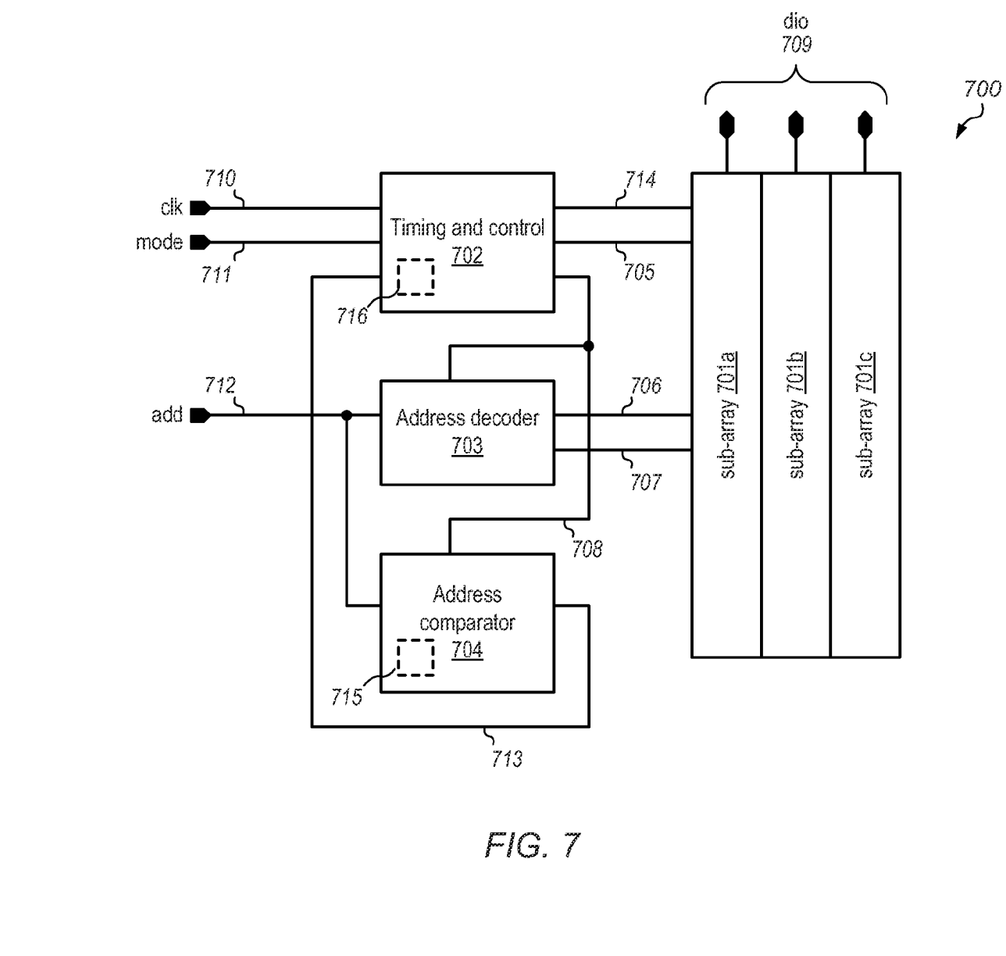
FIG. 7 illustrates an embodiment of a memory.

FIG. 7 illustrates a memory according to one of several possible embodiments. In the illustrated embodiment, memory 700 includes data I/O ports 709 denoted "dio," an address bus input 712 denoted "add," mode selection inputs 711 denoted "mode," and a clock input 710 denoted "clk."

In the illustrated embodiment, memory 700 includes sub-arrays 701a, 701b, and 701c, timing and control unit 702, address decoder 703, and address comparator 704. Sub-arrays 701a, 701b, and 701c may incorporate some or all of the features described above with respect to sub-arrays 300. Timing and control unit 702 is coupled to provide a decoder enable signal 708 to address decoder 703 and address comparator 704, and control signals 705 to sub-arrays 701a, 701b, and 701c. In some embodiments, control signals 705 may include a pre-charge signal, a sense amplifier enable signal, a true data selection signal, a complement data selection, a first load selection signal, and a second load selection signal that may operate as described above with respect to sub-array 300 and load circuits 500 and 600. In other embodiments, timing and control unit 702 may include a test unit 716 that may perform built-in self-test (BIST) functions.

In some embodiments, timing and control unit 702 may be configured to provide bias signal 714. Timing and control unit 702 may include one or more current mirrors and temperature and supply independent voltage and/or current reference circuits (e.g., a band gap reference). In other embodiments, bias signal 714 may be supplied externally to memory 700 by a tester or other circuit blocks in a system-on-a-chip (SOC) implementation.

Address decoder 703 is coupled to provide row selects 706 and column selects 707 to sub-arrays 701a, 701b, and 701c, in response to the assertion of decoder enable signal 705 and the address value on address bus 712. Address comparator 704 is coupled to provide read-miss indication signal 708 to timing and control unit 702 based upon a comparison of the address value on add 712 to a collection of address values previously determined to select weak data storage cells in sub-arrays 701a, 701b, and 701c. In some embodiments, address comparator 704 may include a storage unit 715 configured to store address values that select weak data storage cells.

Figure 8:
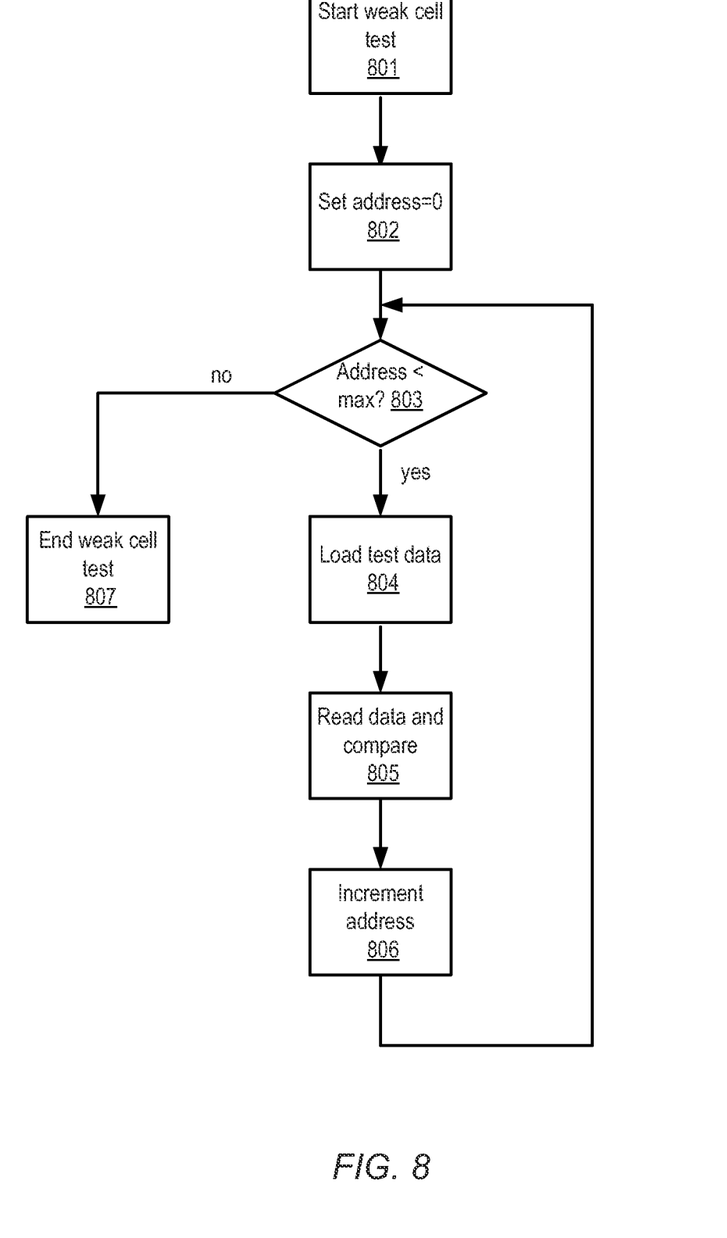
FIG. 8 illustrates a possible method of operating the embodiment illustrated in FIG. 7.

FIG. 8. Illustrates a possible method of operating memory 700 to test for weak data storage cells. Referring collectively to FIG. 7 and the flowchart illustrated in FIG. 8, the operation starts in block 801. The value presented to add 712 is set to zero (block 802). The operation then depends on the value presented to add 712. When the value presented to add 712 exceeds the maximum address of memory 700, the test ends (block 807). When the value presented to add 712 is less than the maximum address of memory 700, mode 711 may be set for a write operation, test data may be presented to dio 709, and clk 710 may be asserted, writing the test data into the data storage cells selected by the value presented to add 712 (block 804).

Once the test data has been loaded, memory 700 may be re-initialized. Mode 711 may be set for read and test operation and clk 710 may be asserted initiating the read and comparison operation as will be described in reference to FIG. 9 (block 805). When the read and comparison operation has completed, memory 700 may be re-initialized and the value presented to add 712 may be incremented (block 806) and the value checked against the maximum address for memory 700 (block 803). It is noted that operations shown in FIG. 8 are merely an illustrative example and that in actual circuit operation, other operations and order of operations may be possible.

Figure 9:
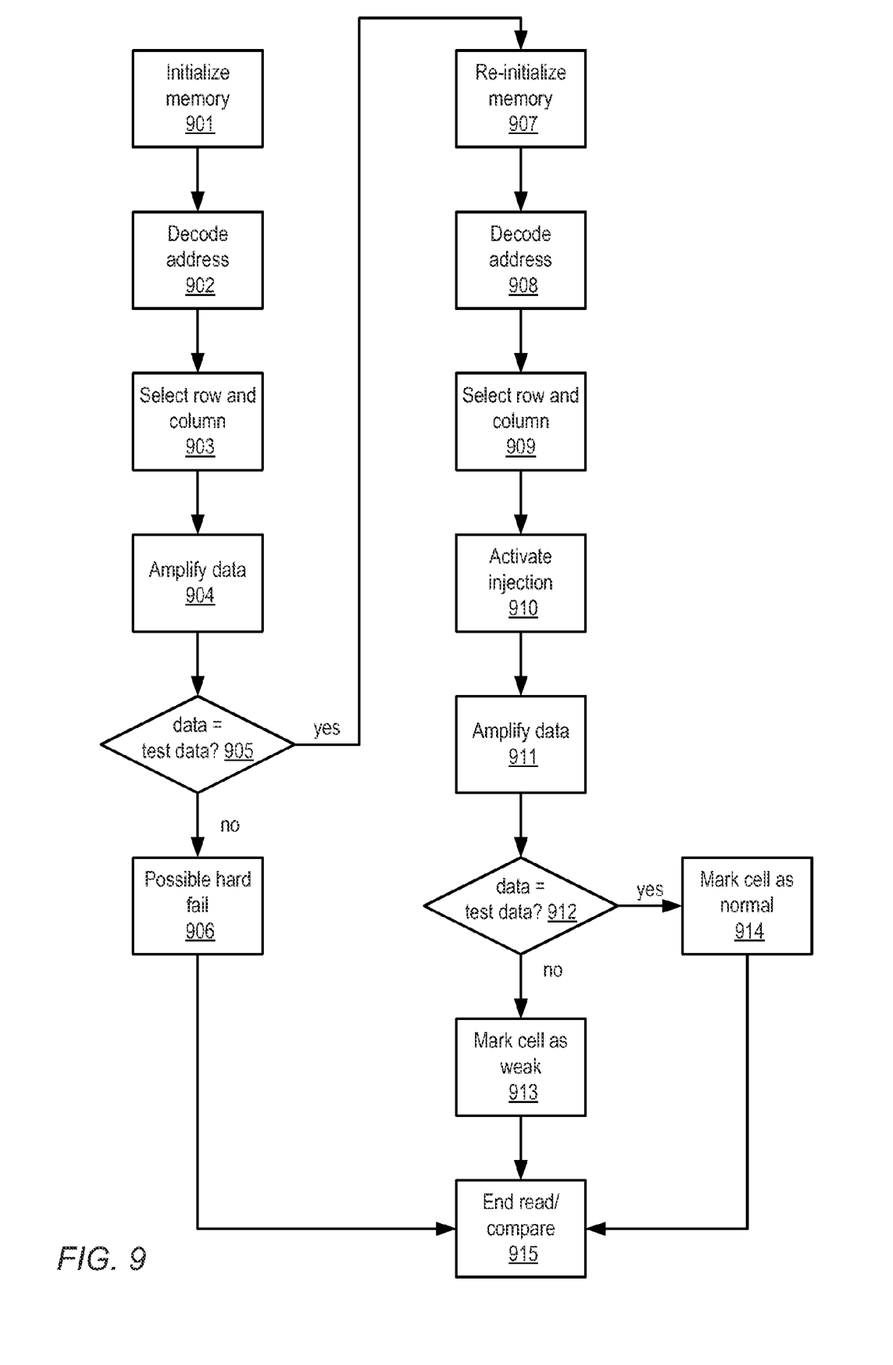
FIG. 9 illustrates a possible method for reading a memory and comparing the stored data to previously loaded test data.

A possible method of operating memory 700 to read and compare previously loaded test data is illustrated in FIG. 9. Referring collectively to FIG. 7 and the flow chart illustrated in FIG. 9, the operation may begin by de-asserting clk 710 to initialize memory 700 (block 901). Mode 711 may be set for normal read operation and clk 710 may be asserted which causes timing and control unit 702 to assert decoder enable signal 708. Address decoder 703 decodes the address presented to add 712 (block 903) in response to the assertion of decoder enable signal 708, and may assert one of row selects 706, and one of column selects 707 (block 903), selecting a data storage cell in each of sub-arrays 701a, 701b, and 701c. Timing and control unit 702 may then assert the appropriate signal in control signals 705 to activate the sense amplifiers in sub-arrays 701a, 701b, and 701c, causing them to amplify the data from the selected data storage cells and output the amplified data to dio 709 (block 904).

The operation then depends on value of data output on dio 709 (block 905). When the data output on dio 709 does not match the originally loaded test data, the selected data storage cells may contain one or more hard failures (block 906). In this test flow, no further action is taken and the test of data storage cells at the given address is complete (block 915). When the data output on dio 709 matches the originally loaded test data, further testing may be necessary and clk 710 may be de-asserted, re-initializing memory 700 (block 907). Mode 711 may be set for test read operation and clk 710 may be asserted. In response to the assertion of clk 710, timing and control unit 702 may assert decoder enable 708, causing decoder 703 to decode the address presented to add 712 (block 908). Address decoder 703 may then assert one of row selects 706 and one of column selects 707, selecting a data storage cell in each of the sub-arrays 701a, 701b, and 701c (block 909). In some embodiments, timing and control unit 702 may then assert the necessary control signals 705 and bias signal 714 to activate current injectors in sub-arrays 701a, 701b, and 701c (block 910). Dependent upon original test data, the current injectors source current to either the true input or the complement input of sense amplifiers. Timing and control unit 702 may then assert the necessary control signals 705 to activate the sense amplifiers, causing the sense amplifiers to amplify the data from the selected data storage cells and couple the amplified data to dio 709.

The newly-read value of the data output on dio 709 may be compared against the originally loaded test data (block 912). When the data output on dio 709 matches the originally loaded test data, the selected data storage cells have sufficient read current to overcome the additional load provided by the load circuits. The address that selected these data storage cells may be noted as containing cells of normal strength (block 914). The test operation at the given address may be complete (block 915). When the data output on dio 709 does not match the originally loaded test data, one or more of the selected data storage cells do not have sufficient read current to overcome the additional load provided by the load circuits. The address that selected these data storage cells may be noted as containing weak data storage cells (block 913). The test operation at the given address may then be complete (block 915). In some embodiments, the address may be loaded into storage unit 715 such that when the given address is encountered in a subsequent read access to memory 700, address comparator 704 asserts misread indication signal 713. It is noted that during actual circuit operation, some or all of the operations illustrated in FIG. 9 may occur in a different order, or may occur concurrently rather than sequentially.

Figure 10:
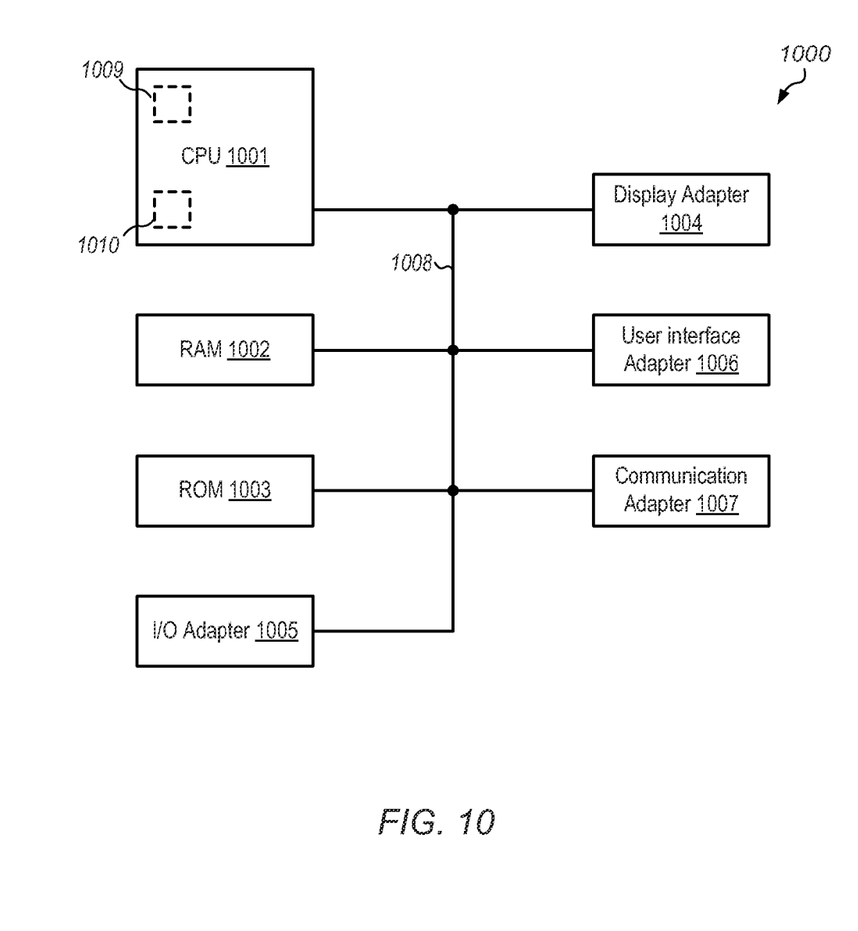
FIG. 10 illustrates an embodiment of a computing system.

Turning now to FIG. 10, a block diagram of a system is illustrated. In the illustrated embodiment, the system 1000 includes an instance of a random access memory (RAM) 1002 and a read-only memory (ROM) 1003 each of which each may include one or more sub-arrays that may incorporate some or all of the features described above with respect to sub-array 300.

The illustrated embodiment also includes a CPU 1001 which may include one or more local storage units 1009. For example, CPU 1001 may include a Cache Data RAM, a Tag RAM, one or more register files, and one or more FIFOs. Each one of the local storage units 1009 may include one or more current injectors that may incorporate some or all of the features described above with respect to current injectors 500 and 600. In some embodiments, CPU 1001 may include a test unit 1010 configured to operate the current injectors. Test unit 1010 may include one or more current mirror and supply and temperature independent voltage and/or current references to generate the necessary bias signal. Additionally, the illustrated embodiment includes an I/O adapter 1005, a display adapter 1004, a user interface adapter 1006, and a communication adapter 1007.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a plurality of columns;
      wherein each of the columns includes a plurality of data storage cells, wherein each given one of the data storage cells is configured such that in response to assertion of a row selection signal, the given data storage cell generates a column output; and
   a column multiplexer coupled to receive input data from the plurality of columns, wherein the column multiplexer is configured to controllably select data from one of the plurality of columns to generate a column multiplexer output signal dependent upon a column selection signal; and a sense amplifier configured to amplify the column multiplexer output signal by the gain level of the sense amplifier in response to assertion of a control signal; and a current injector configured to source current to the input of the sense amplifier in response to assertion of a current control signal.

2. The apparatus of claim 1, wherein the current sourced by the current injector is dependent upon a bias signal.

3. The apparatus of claim 1, wherein the sense amplifier is further configured to receive input data from the column multiplexer that is differentially encoded, and wherein the current injector is further configured to source current to a selected one of the sense amplifier differential inputs in response to the assertion of a data selection signal.

4. The apparatus of claim 1, wherein the current injector is further configured to sink current from the input of the sense amplifier.

5. A method, comprising:
storing test data into a data storage cell; and
sourcing current to the input of a sense amplifier during a read operation; and
amplifying the stored test data from the data storage using the sense amplifier.

6. The method of claim 5, further comprising:
comparing the amplified data from the sense amplifier to the test data; and
detecting the strength of the data storage cell.

7. The method of claim 6, further comprising:
storing cell strength information indicative of the detected strength of the data storage cell.

8. The method of claim 7, further comprising:
asserting a misread indication signal when the amplified data matches the test data.

9. An apparatus, comprising:
a plurality of data storage cells; and
a sense amplifier configured to amplify data in the data storage cells; and
a current injector configured to source a first current to the input of the sense amplifier when reading a first data storage cell, and to source a second current to the input of the sense amplifier when reading a second data storage cell.

10. The apparatus of claim 9, wherein the second current is larger than the first current.

11. The apparatus of claim 9, wherein the current injector is further configured to sink the first current from the input of the sense amplifier when reading the first data storage cell, and to sink the second current from the input of the sense amplifier when reading the second data storage cell.

12. The apparatus of claim 9, wherein the current injector is further configured to simultaneously source the first current and the second current to the input of the sense amplifier.

13. A memory circuit, comprising:
a plurality of sub-arrays;
wherein each of the sub-arrays comprises:
a plurality of columns;
wherein each of the columns comprises:
a plurality of data storage cells, wherein each given one of the data storage cells is configured such that, in response to the assertion of a respective one of a plurality of row selection signals, the given data storage cells generates a column output signal; and
a column multiplexer configured to receive the column output signal from each one of the plurality of columns, wherein the column multiplexer is configured to controllably select the column output signal from one of the plurality of columns in response to the assertion of a respective one of a plurality of column selection signals; and
a sense amplifier configured to amplify the column output signal from the selected one of the plurality of columns; and
a current injector configured to source a current to the input of the sense amplifier in response to assertion of a test signal; and
a timing and control unit configured to generate a plurality of control signals; and
an address decoder configured to assert one of the plurality of row select signals and one of the plurality of column select signals dependent upon an input address.

14. The memory of claim 13, wherein the address decoder includes a storage array and a comparator configured to compare the input address to the contents of the storage array.

15. The memory of claim 13, wherein the plurality of data storage cells are further configured to output differentially encoded data, and wherein the sense amplifier is further configured to amplify differentially encoded data, and wherein the current injector is further configured to source current to a selected one of the sense amplifier differential inputs.

16. The memory of claim 15, wherein the timing and control unit includes a self-test unit configured to generate the test signal.

17. A system, comprising:
a processing unit; and
one or more memories;
wherein the processing unit comprises:
one or more storage arrays;
wherein each of the each of the storage arrays comprises:
a plurality of data storage cells; and
a plurality of output circuits;
wherein each of the output circuits comprises:
a sense amplifier configured to amplify data from a selected one of the plurality of data storage cells; and
a current injector configured to source current to the input of the sense amplifier in response to assertion of a test signal.

18. The system of claim 17, the processing unit includes a test unit configured to generate the test signal for each given one of the storage arrays.

19. The memory of claim 18, the current injector is further configured to source a first current, or to source second current to the input of the sense amplifier dependent upon a current selection signal.

20. The memory of claim 19, wherein the test unit is further configured to generate the current selection signal for each given one of the storage arrays.

* * * * *